United States Patent
Marchais et al.

(10) Patent No.: US 10,193,505 B2
(45) Date of Patent: Jan. 29, 2019

(54) CONFIGURABLE CONTROL LOOP TOPOLOGY FOR A PULSE WIDTH MODULATION AMPLIFIER

(71) Applicant: Cirrus Logic International Semiconductor Ltd., Edinburgh (GB)

(72) Inventors: Emmanuel Marchais, Dripping Springs, TX (US); Lingli Zhang, Austin, TX (US); Eric J. King, Austin, TX (US); Christian Larsen, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/661,446

(22) Filed: Jul. 27, 2017

(65) Prior Publication Data

US 2018/0041173 A1    Feb. 8, 2018

Related U.S. Application Data

(60) Provisional application No. 62/371,507, filed on Aug. 5, 2016.

(51) Int. Cl.
*H03F 3/38* (2006.01)
*H03F 1/32* (2006.01)
(Continued)

(52) U.S. Cl.
CPC ............. *H03F 1/32* (2013.01); *H03F 3/187* (2013.01); *H03F 3/2175* (2013.01); *H03F 2200/165* (2013.01); *H03F 2200/351* (2013.01)

(58) Field of Classification Search
CPC .................................. H03F 3/38; H03F 3/217
(Continued)

(56) References Cited

U.S. PATENT DOCUMENTS

2007/0024365 A1    2/2007    Ramaswamy et al.
2009/0238382 A1    9/2009    Unou
(Continued)

FOREIGN PATENT DOCUMENTS

EP    1001526 A1    5/2000
EP    2469699 A2    6/2012

OTHER PUBLICATIONS

Combined Search and Examination Report under Sections 17 and 18(3), UKIPO, Application No. GB1712536.0, dated Feb. 5, 2018.
(Continued)

*Primary Examiner* — Steven J Mottola
(74) *Attorney, Agent, or Firm* — Jackson Walker L.L.P.

(57) ABSTRACT

In accordance with embodiments of the present disclosure, a system may have a configurable control loop technology, wherein the system comprises a first mode control loop, a second mode control loop and a reconfigurable pulse width modulator (PWM) configured to generate an output signal from an input signal. The reconfigurable PWM may include a digital PWM and an analog PWM and may be configured such that when the first mode control loop is activated, the reconfigurable PWM utilizes the analog PWM to generate the output signal from the input signal and when the second mode control loop is activated, the reconfigurable PWM utilizes the digital PWM to generate the output signal from the input signal and the digital PWM receives its input from a digital proportional integral derivative controller.

60 Claims, 2 Drawing Sheets

(51) Int. Cl.
*H03F 3/187* (2006.01)
*H03F 3/217* (2006.01)

(58) Field of Classification Search
USPC .............................. 330/10; 332/109; 375/238
See application file for complete search history.

(56) References Cited

U.S. PATENT DOCUMENTS

| | | | |
|---|---|---|---|
| 2010/0013554 A1* | 1/2010 | Park | H03F 3/217 |
| | | | 330/10 |
| 2012/0194141 A1 | 8/2012 | Shi et al. | |
| 2012/0286750 A1 | 11/2012 | Xu | |
| 2013/0249511 A1 | 9/2013 | Kalje et al. | |
| 2013/0258731 A1 | 10/2013 | Xu et al. | |
| 2015/0281831 A1* | 10/2015 | Ibusuki | H03F 3/183 |
| | | | 381/74 |

OTHER PUBLICATIONS

International Search Report and Written Opinion of the International Searching Authority, International Application No. PCT/US2017/044195, dated Nov. 2, 2017.
Lu, Chien-Chun etal., A 5V Output Voltage Boost Siwching Converter with Hybrid Digital and Analog PWM Contrl, Low Power Electronics and Design, ACM, NY, NY, Aug. 18, 2010, pp. 99-104.

* cited by examiner

CONFIGURABLE CONTROL LOOP TOPOLOGY FOR A PULSE WIDTH MODULATION AMPLIFIER

RELATED APPLICATION

The present disclosure claims priority to U.S. Provisional Patent Application Ser. No. 62/371,507, filed Aug. 5, 2016, which is incorporated by reference herein in its entirety.

FIELD OF DISCLOSURE

The present disclosure relates in general to circuits for audio and haptic devices, including without limitation personal audio devices, such as wireless telephones and media players, or devices comprising a haptic module.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers. Generally speaking, a power amplifier amplifies an audio signal by taking energy from a power supply and controlling an audio output signal to match an input signal shape but with a larger amplitude.

One example of an audio amplifier is a class-D amplifier. A class-D amplifier (also known as a "switching amplifier") may comprise an electronic amplifier in which the amplifying devices (e.g., transistors, typically metal-oxide-semiconductor field effect transistors) operate as electronic switches. In a class-D amplifier, a signal to be amplified may be converted to a series of pulses by pulse-width modulation, pulse-density modulation, or another method of modulation, such that the signal is converted into a modulated signal in which a characteristic of the pulses of the modulated signal (e.g., pulse widths, pulse density, etc.) is a function of the magnitude of the signal. After amplification with a class-D amplifier, the output pulse train may be converted to an unmodulated analog signal by passing through a passive low-pass filter, wherein such low-pass filter may be inherent in the class-D amplifier or a load driven by the class-D amplifier. Class-D amplifiers are often used due to the fact that they may be more power efficient than linear analog amplifiers, in that class-D amplifiers may dissipate less power as heat in active devices as compared to linear analog amplifiers.

Typically, a voltage-mode closed-loop PWM amplifier is chosen in order to provide accurate load voltage with desirable Total Harmonic Distortion (THD) and Power Supply Rejection Ratio (PSRR). A closed-loop voltage-mode PWM amplifier typically takes an analog voltage input and a sensed feedback voltage signal which are fed through a closed-loop analog PWM modulator to drive voltage on the speaker load.

However, an option to alternatively drive loads using a single PWM amplifier circuit in either current or voltage-mode depending on the specific application may be desirable. For current-mode operation, accurate current control for large variations of load impedance is needed. To achieve such accurate current control with large variations of load impedance, existing analog PWM modulator based voltage-mode controls are not flexible enough for handling the potential high quality factor (Q) of load resonance. High Q of load resonance can create a ripple in the closed-loop transfer function.

SUMMARY

In accordance with the teachings of the present disclosure, one or more disadvantages and problems associated with existing approaches to processing signals with an amplifier may be reduced or eliminated.

In accordance with embodiments of the present disclosure, a system may have a configurable control loop technology, wherein the system comprises a first mode control loop, a second mode control loop and a reconfigurable pulse width modulator (PWM) configured to generate an output signal from an input signal. The reconfigurable PWM may include a digital PWM and an analog PWM and may be configured such that when the first mode control loop is activated, the reconfigurable PWM utilizes the analog PWM to generate the output signal from the input signal and when the second mode control loop is activated, the reconfigurable PWM utilizes the digital PWM to generate the output signal from the input signal and the digital PWM receives its input from a digital proportional integral derivative controller.

In accordance with these and other embodiments of the present disclosure, a method for configurable control loop technology in a system having a first mode control loop, a second mode control loop, and a reconfigurable pulse width modulator (PWM) having a digital PWM and an analog PWM and configured to generate an output signal from an input signal, may include: when the first mode control loop is activated, utilizing the analog PWM to generate the output signal from the input signal and when the second mode control loop is activated, utilizing the digital PWM to generate the output signal from the input signal and the digital PWM receives its input from a digital proportional integral derivative controller.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
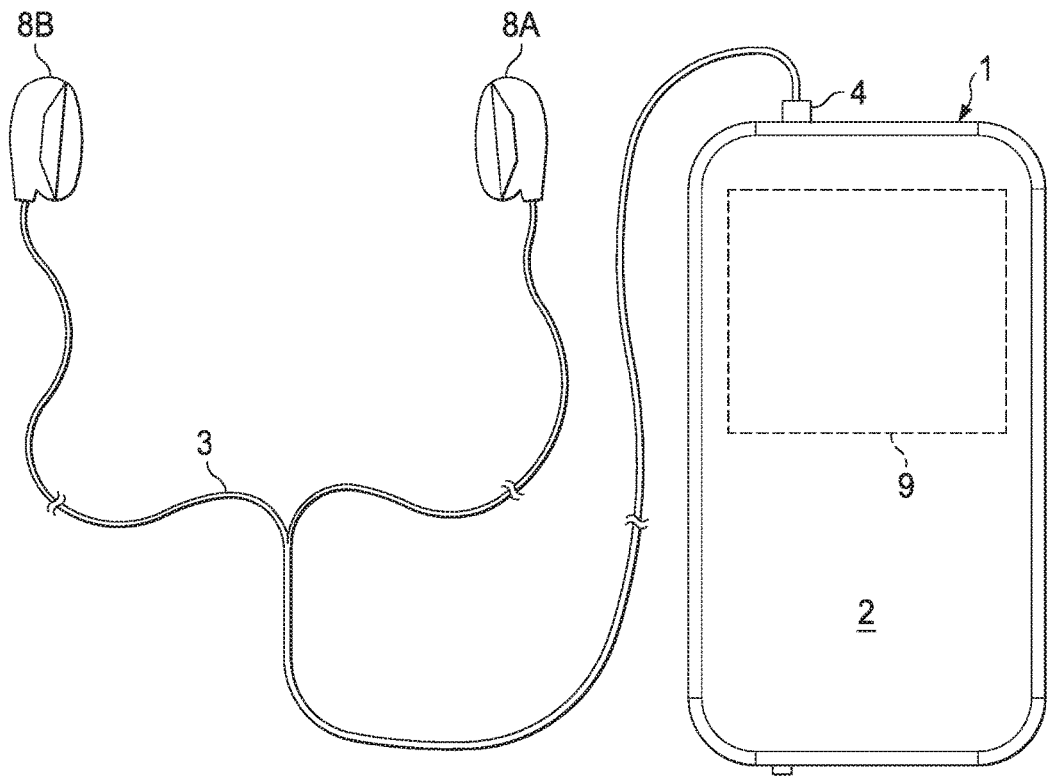
FIG. 1 is an illustration of an example personal audio device, in accordance with embodiments of the present disclosure.

FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer (e.g., a loudspeaker).

Figure 2A:
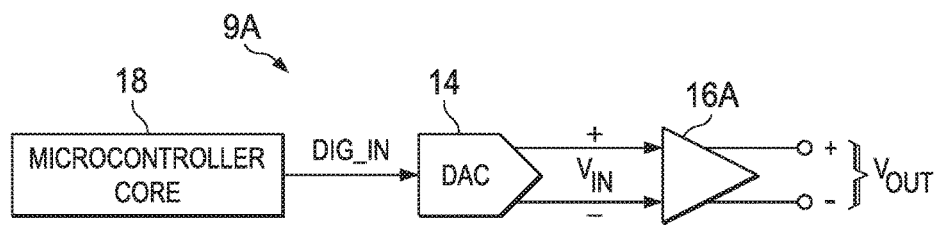
FIG. 2A is a block diagram of selected components of an example audio integrated circuit of a personal audio device employing analog voltage-mode amplification, in accordance with embodiments of the present disclosure.

FIG. 2A is a block diagram of selected components of an example audio IC 9A of a personal audio device employing analog voltage-mode amplification, in accordance with embodiments of the present disclosure. In some embodiments, example audio IC 9A may be used to implement audio IC 9 of FIG. 1. As shown in FIG. 2A, a microcontroller core 18 (e.g., a digital signal processor or "DSP") may supply a digital audio input signal DIG_IN to a digital-to-analog converter (DAC) 14, which may convert the digital audio input signal to an analog input signal $V_{IN}$. DAC 14 may supply analog signal $V_{IN}$ to an amplifier 16A which may amplify or attenuate analog input signal $V_{IN}$ to provide an audio output signal $V_{OUT}$, which may operate a speaker, headphone transducer, a line level signal output, and/or other suitable output.

Figure 2B:
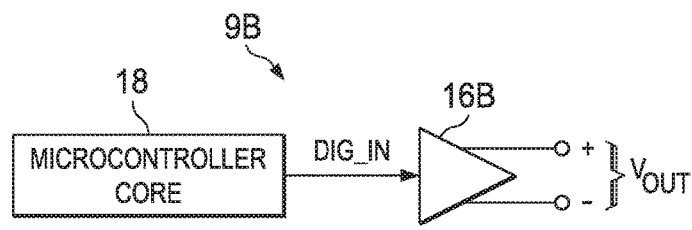
FIG. 2B is a block diagram of selected components of an example audio integrated circuit of a personal audio device employing digital current-mode amplification, in accordance with embodiments of the present disclosure.

FIG. 2B is a block diagram of selected components of an example audio IC 9B of a personal audio device employing digital current-mode amplification, in accordance with embodiments of the present disclosure. In some embodiments, example audio IC 9B may be used to implement audio IC 9 of FIG. 1. As shown in FIG. 2B, a microcontroller core 18 (e.g., a DSP) may supply a digital audio input signal DIG_IN to an amplifier 16B which may amplify or attenuate digital audio input signal DIG_IN to provide an audio output signal $V_{OUT}$, which may operate a speaker, headphone transducer, a line level signal output, and/or other suitable output.

Figure 3:
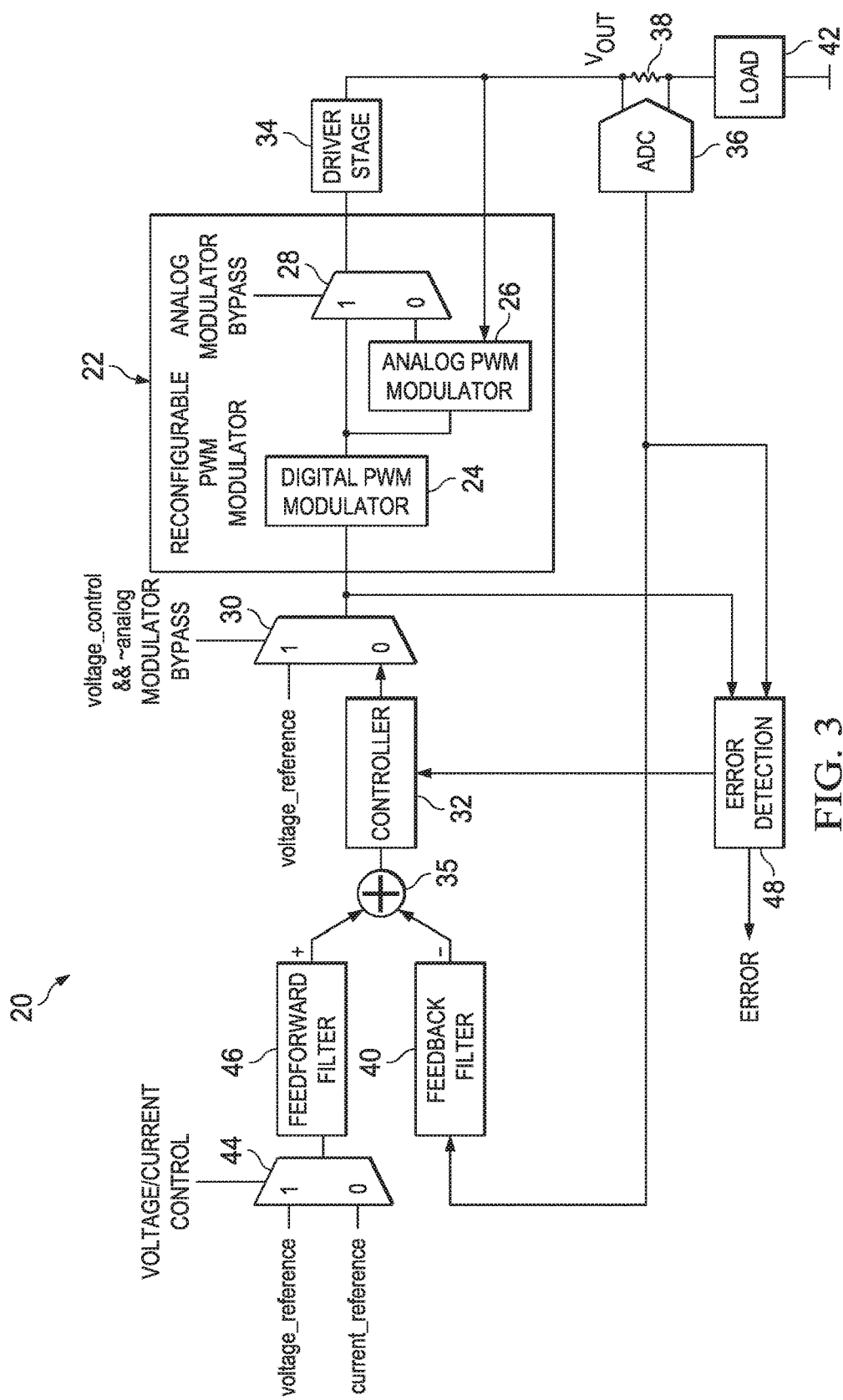
FIG. 3 is a block diagram of selected components of an example pulse width modulation amplifier, in accordance with embodiments of the present disclosure.

FIG. 3 is a block diagram of selected components of an example pulse width modulation amplifier 20, in accordance with embodiments of the present disclosure. In some embodiments, example pulse width modulation amplifier 20 may be used to implement amplifier 16A of FIG. 2A and/or amplifier 16B of FIG. 2B. As shown in FIG. 3, example pulse width modulation amplifier 20 may comprise a control loop topology which includes a reconfigurable pulse-width modulation (PWM) modulator 22. Reconfigurable PWM modulator 22 may include a digital PWM modulator 24 and an analog PWM modulator 26, along with a direct bypass function implemented with a multiplexer 28.

Reconfigurable PWM modulator 22 may be configured to operate in a first mode control through the use of analog PWM modulator 26 when a first mode control loop is activated (e.g., when the ANALOG MODULATOR BYPASS control signal received by multiplexer 28 is deasserted). The first mode control may be a voltage-mode control, and the first mode control loop may be a voltage-mode control loop. Reconfigurable PWM modulator 22 may also be configured to operate in a second mode control through the use of digital PWM modulator 24 when a second mode control loop is activated (e.g., when the ANALOG MODULATOR BYPASS control signal received by multiplexer 28 is asserted). The second mode control may be a current-mode control, and the second mode control loop may be a current-mode control loop. Alternatively, in some embodiments the second mode control may be a voltage-mode control, and the second mode control loop may be a voltage-mode control loop. As shown in FIG. 3, analog PWM modulator 26 may receive its input from digital PWM modulator 24.

When the first mode control loop is activated (e.g., when the ANALOG MODULATOR BYPASS control signal received by multiplexer 28 is deasserted), digital PWM modulator 24 may receive a voltage reference signal (e.g., input voltage VIN depicted in FIG. 2A) output by a multiplexer 30 as its input signal. When the second mode control loop is activated, digital PWM modulator 24 may receive a voltage reference signal from an output of a controller 32 that may, in some embodiments, comprise a proportional integral derivative controller.

Accordingly, reconfigurable PWM modulator 22 may support at least both a voltage-mode and a current-mode without any significant additional cost and/or hardware as compared to traditional approaches. In other words, for current-mode control (e.g., second mode control), analog PWM modulator 26 may be bypassed by multiplexer 28, and digital PWM modulator 24 may be utilized such that the output of digital PWM modulator 24 is directly fed into a driver stage 34. For voltage-mode control (e.g., second mode control), analog PWM modulator 26 may be utilized such that the output of analog PWM modulator 26 is directly fed into driver stage 34. Driver stage 34 may comprise a plurality of output switches configured to generate output signal $V_{OUT}$ from a modulated signal generated by reconfigurable PWM modulator 22.

Thus, in operation in the first mode control, the first mode control loop comprises digital PWM modulator 24 that receives a digital voltage reference, analog PWM modulator 26, multiplexer 28 selected to pass the output of analog PWM modulator 26, driver stage 34, and a feedback path which is fed back to analog PWM modulator 26. When the first mode control loop is activated, analog PWM modulator 26 and digital PWM modulator 24 may both be utilized. Also, the first mode control loop and the second mode control loop may be simultaneously utilized when the first mode control loop is activated.

In operation in the second mode control with current-mode control, the second mode control comprises controller 32 that receives as its input an error signal (e.g., from summer 35) which is a difference between a current reference signal and a digital feedback signal generated by a feedback path. The feedback path may comprise an analog-to-digital converter (ADC) 36 for converting an analog signal indicative of an output current as sensed by sense resistor 38 into a corresponding digital signal, and may also comprise a feedback filter 40 configured to filter the digital signal to generate the digital feedback signal. The second mode control loop also comprises digital PWM modulator 24, multiplexer 28 selected to the output of digital PWM modulator 24 and bypass analog PWM modulator 26, and driver stage 34.

In operation in the second mode control with voltage-mode control, the second mode control comprises controller 32 that receives as its input an error signal (e.g., from summer 35) which is a difference between a voltage reference signal and a digital feedback signal generated by a feedback path. The feedback path may comprise an analog-to-digital converter (ADC) 36 for converting an analog signal indicative of an output voltage as sensed by sense resistor 38 into a corresponding digital signal, and may also comprise feedback filter 40 configured to filter the digital signal to generate the digital feedback signal. The second mode control loop also comprises digital PWM modulator 24, multiplexer 28 selected to the output of digital PWM modulator 24 and bypass analog PWM modulator 26, and driver stage 34.

Changing amplifier 20 from voltage-mode to current-mode and vice versa may be achieved by changing an input source to the digital PWM modulator by use of multiplexer 30.

Another implementation of a closed loop voltage-mode control is to sense output voltage $V_{OUT}$ directly and digitize the voltage signal through ADC 36. In this voltage-mode control implementation, analog PWM modulator 26 is not needed, and the current sense output may be replaced with the voltage sense output, and a voltage reference input may replace the current reference input under the control of multiplexer 44. In this implementation, the ADC-based voltage-mode may have a larger latency than the analog PWM modulator approach.

In voltage-mode operation, the output of digital PWM modulator 24 may account for digital PWM encoding distortion by pre-distorting the signal to its encoder such that the digital PWM encoded signal has no distortion.

For current-mode control (e.g., implemented by second mode control loop), load current may be directly sensed by sense resistor 38 and digitized through ADC 36. A typical voltage-mode closed-loop amplifier may include an ability to sense current. Accordingly, such current sensing may come at no additional cost as compared to traditional approaches.

In addition, in current-mode operation, a digital input signal to digital PWM modulator 24 may be received from controller 32, acting as a current controller. Controller 32 may filter an error formed by the difference between a reference current input and the digitized sensed current going through sense resistor 38 in series with a load 42 of amplifier 20.

As described above, the feedback path of the second mode control loop may include feedback filter 40. Feedback filter 40 may filter the digitized signal generated by ADC 36 in order to reduce noise and/or to compensate for the ADC and analog front-end transfer function. For example, feedback filter 40 may calibrate the sense path of sense resistor 38 and may reduce sensor noise (e.g., reduce noise present in the digital feedback signal). The sense path may be composed of a voltage ADC, current ADC 36, or a combination of multiple sensed signals to provide a better estimate of the signal fed back to form the error output to controller 32. In some embodiments, feedback filter 40 may comprise a low-latency feedback filter configured to filter the digital feedback signal to generate a filtered digital feedback signal and provide the filtered digital feedback signal, in combination with the voltage reference signal or current reference signal, as an input signal to controller 32. In such embodiments, such low-latency feedback filter may be configured to decimate the digital feedback signal to generate the filtered digital feedback signal. In addition or alternatively, such low-latency feedback filter may be configured to combine multiple digitized signal sources in order to generate the filtered digital feedback signal, as described in U.S. Pat. Pub. No. 2017/0138990.

As shown in FIG. 3, amplifier 20 may also include a feedforward filter 46 that may implement gain and/or spectral shaping of an input current reference signal or input voltage reference signal. In the second loop control mode, a digital control loop is implemented and feedforward filter 46 may be configured such that the combined responses of feedforward filter 46, controller 32, and a feedback path of the system provide desired spectral properties for the system. Thus, feedforward filter 46, feedback filter 40, and controller 32 may be tuned together to achieve an optimal tradeoff between signal transfer function bandwidth from the reference input to load 42 versus rejection of load disturbances, supply noise, PWM distortion, and/or ADC 36 noise. In such digital control loop, controller 32 may be designed to set a desired bandwidth for the digital control loop. A high bandwidth for the digital control loop may improve total harmonic distortion noise as distortion introduced in the amplifier path is reduced. A low bandwidth may improve signal-to-noise ratio to reduce noise in the sense path. Feedforward filter 46 may be used to decouple the transfer function to load 42 from the closed-loop transfer function of the digital control loop. For instance, the transfer function to load 42 may be set to a be a low-pass filter with a fixed bandwidth independent of the loop bandwidth. In that case, the step response of the system is unchanged while the loop bandwidth provides a way to tune a trade-off between total harmonic distortion noise and signal-to-noise ratio. In another instance, the transfer function to load 42 can be set to be a low-pass filter with a bandwidth that tracks the loop bandwidth with a fixed ratio. If the ratio is greater than unity, the effect may be to increase the apparent bandwidth of the transfer function from the input to the load. Such approach may advantageously reduce droop in the bandwidth of interest or increase the usable bandwidth beyond the stability limits of the closed loop. In yet another instance, the ratio may be set less than unity. In that case, the high loop bandwidth may provide suitable total harmonic distortion noise while the low input-to-load bandwidth limits settling of the controlled variable. If such variable is a current driving a highly inductive load, the input bandwidth limiting may help to avoid voltage overshoot.

Thus, feedforward filter 46 may be configured with poles and zeroes to cancel dominant poles and zeroes of a closed-loop transfer function defined by controller 32. For example, feedforward filter 46 may be configured with poles and zeroes such that a first bandwidth between the reference input and the output of reconfigurable PWM modulator 22 is higher than a second bandwidth of controller 32. Alternatively, feedforward filter 46 may be configured with poles and zeroes such that a first bandwidth between the reference input and the output of reconfigurable PWM modulator 22 is lower than a second bandwidth of controller 32.

Amplifier 20 may also include an error detection block 48 that monitors for conditions in which the output of reconfigurable PWM modulator 22 saturates due to a finite power supply. When this saturation condition occurs, controller 32 or error detection block 48 may signal the error condition (e.g., with an interrupt) to a source of the reference signal in order to take appropriate action. In addition or alternatively, responsive to a saturation condition, controller 32 may also freeze the control loop to prevent state-variables from building up additional error, which may lead to output artifacts when the saturation condition is removed. With voltage and current information available, controller 32 may also monitor the power delivered to load 42 to limit a voltage or a current produced at load 42. For example, the maximum voltage output by amplifier 20 may be limited to a specified value less than the supply level which may be desirable to protect the supply or load 42. To further illustrate, controller 32 may comprise a plurality of integrators including a final stage integrator in which the final stage integrator is limited by a saturation limit. The saturation limit may be implemented by computing a limit level that the final stage integrator in controller 32 needs to reach to produce the limited voltage level and then applying that limit to the final stage integrator.

In some embodiments, the saturation limit may be dynamically adjusted in real time based on one or more of an amplifier mode of the system, conditions of a load driven by a driver stage 34 that receives the output signal of reconfigurable PWM modulator 22, a supply voltage supplied to driver stage 34, and a user-established voltage limit. In these and other embodiments, amplifier 20 may receive the saturation limit from a monitoring circuit external to amplifier 20. In these and other embodiments, a detection of violation of the saturation limit may be received via an interrupt for external management of a condition causing the violation.

In some embodiments, load 42 may have a resonance well below the bandwidth of the controller 32. For example, load 42 may comprise a linear resonant actuator with resonant frequency of approximately 100 hertz to approximately 200 hertz while the closed-loop bandwidth of amplifier 20 may be between approximately 2 kilohertz to approximately 20 kilohertz. In that case, when operating in current mode, a high quality factor (Q) of the resonance may create a ripple in the closed-loop transfer function. The ripple may be practically rejected by adding a low-frequency resonator section in controller 32 for the open-loop transfer function (TF) to have high gain around the load resonance. Thus, in operation, a resonance frequency of the low-frequency resonator section may be significantly less than a bandwidth between the reference input and the output of reconfigurable PWM modulator 22. In some embodiments, control parameters of the low-frequency resonator section (e.g., quality factor and/or resonant frequency of the low-frequency resonator section) and other portions of controller 32 may be independently tunable. In some of such embodiments, the quality factor and/or the resonant frequency may be tunable based on properties of a resonant load 42.

In some embodiments, driver stage 34 may comprise a variable-strength driver stage. The drive-strength of driver stage 34 may be switched on the fly with minor (e.g., non-audible) disturbance to load 42. Increasing the drive strength during low output-power passages may save switching losses, thus improving amplifier efficiency. For example, when analog PWM modulator 26 is driving the analog control loop, power supply rejection ratio of a power supply may automatically reduce a change in drive-strength when an analog control mode is engaged. In a digital control mode, the digital control loop may eventually reduce the disturbance due to the load impedance change. However, for an improved response, the controller gain of controller 32 may be changed on the fly at the precise instant the drive-strength of driver stage 34 changes. The gain may be changed by the ratio of the impedance seen by the amplifier before and after the drive-strength change. Thus, amplifier 20 may include circuitry to detect power conditions on an output of the variable-strength driver stage and control a strength of the variable-strength driver stage in order to minimize switching losses of the variable-strength driver stage. In addition, controller 32 may be configured to modify one or more of its filter parameters in response to a change in the strength of the variable-strength driver stage.

Advantageously, the foregoing provides systems and methods for implementing and using a system comprising a reconfigurable amplifier used with a voltage ADC or a current ADC, wherein the amplifier can switch from a voltage amplification mode to a current amplification mode with minimal additional digital logic as compared to that of existing amplifier systems.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. A system having a configurable control loop technology, the system comprising:
   a first mode control loop;
   a second mode control loop; and
   a reconfigurable pulse width modulator (PWM) configured to generate an output signal from an input signal, wherein the reconfigurable PWM comprises a digital PWM and an analog PWM and is configured such that:
      when the first mode control loop is activated, the reconfigurable PWM utilizes the analog PWM to generate the output signal from the input signal; and
      when the second mode control loop is activated, the reconfigurable PWM utilizes the digital PWM to generate the output signal from the input signal, and the digital PWM receives its input from a controller configured to generate such input to the digital PWM based on a difference between the input signal and a feedback signal generated by a feedback path of the second mode control loop.

2. The system of claim 1, wherein the digital PWM and the analog PWM are arranged such that the analog PWM receives an output of the digital PWM as an input of the analog PWM.

3. The system of claim 1, wherein when the first control loop is activated, the analog PWM and the digital PWM are both utilized to generate the output signal from the input signal.

4. The system of claim 3, wherein both the first control loop and the second control loop are capable of being simultaneously activated.

5. The system of claim 1, wherein both the first control loop and the second control loop are capable of being simultaneously activated.

6. The system of claim 1, wherein the first mode control loop comprises a voltage-mode control loop.

7. The system of claim 1, wherein the second mode control loop comprises a current-mode control loop.

8. The system of claim 1, wherein the second mode control loop comprises a voltage-mode control loop.

9. The system of claim 1, wherein the system further comprises a feedback path comprising:
an analog-to-digital converter configured to receive an analog signal indicative of the output signal and convert the analog signal to an equivalent digital feedback signal; and
a low-latency feedback filter configured to filter the digital feedback signal to generate a filtered digital feedback signal and provide the filtered digital feedback signal as an input signal to the controller.

10. The system of claim 9, wherein the low-latency feedback filter is configured to decimate the digital feedback signal to generate the filtered digital feedback signal.

11. The system of claim 9, wherein the low-latency feedback filter is configured to reduce noise present in the digital feedback signal.

12. The system of claim 9, wherein the low-latency feedback filter is configured to combine multiple digitized signal sources in order to generate the filtered digital feedback signal.

13. The system of claim 1, wherein the system further comprises a feedforward filter coupled between a reference input and an input of the controller.

14. The system of claim 13, wherein the feedforward filter is configured such that the combined responses of the feedforward filter, the controller, and a feedback path of the system provide desired spectral properties for the system.

15. The system of claim 14, wherein the feedforward filter is configured with poles and zeroes to cancel dominant poles and zeroes of a closed-loop transfer function defined by the controller.

16. The system of claim 15, wherein the feedforward filter is configured with poles and zeroes such that a first bandwidth between the reference input and the output of the reconfigurable PWM is higher than a second bandwidth of the controller.

17. The system of claim 15, wherein the feedforward filter is configured with poles and zeroes such that a first bandwidth between the reference input and the output of the reconfigurable PWM is lower than a second bandwidth of the controller.

18. The system of claim 15, wherein:
the controller comprises a plurality of integrators including a final stage integrator; and
the final stage integrator is limited by a saturation limit.

19. The system of claim 18, wherein the saturation limit is dynamically adjusted in real time based on one or more of an amplifier mode of the system, conditions of a load driven by a driver stage that receives the output signal of the reconfigurable PWM, a supply voltage supplied to the driver stage, and a user-established voltage limit.

20. The system of claim 18, wherein the system receives the saturation limit from a monitoring circuit external to the system.

21. The system of claim 18, wherein a detection of violation of the saturation limit is received via an interrupt for external management of a condition causing the violation.

22. The system of claim 1, wherein the controller comprises a low-frequency resonator section.

23. The system of claim 22, wherein a resonance frequency of the low-frequency resonator section is significantly less than a bandwidth between a reference input and the output of the reconfigurable PWM.

24. The system of claim 22, wherein control parameters of the low-frequency resonator section and other portions of the controller are independently tunable.

25. The system of claim 24, wherein the control parameters comprise a quality factor and a resonant frequency of the low-frequency resonator section.

26. The system of claim 25, wherein the quality factor and the resonant frequency are tunable based on properties of a resonant load driven by a driver stage that receives the output signal of the reconfigurable PWM.

27. The system of claim 1, further comprising a variable-strength driver stage that receives the output signal of the reconfigurable PWM.

28. The system of claim 27, further comprising a circuit to detect power conditions on an output of the variable-strength driver stage and control a strength of the variable-strength driver stage in order to minimize switching losses of the variable-strength driver stage.

29. The system of claim 27, wherein the controller is configured to modify one or more of its filter parameters in response to a change in the strength of the variable-strength driver stage.

30. The system of claim 1, wherein the controller comprises a digital proportional integral derivative controller.

31. A method for configurable control loop technology in a system having a first mode control loop, a second mode control loop, and a reconfigurable pulse width modulator (PWM) having a digital PWM and an analog PWM and configured to generate an output signal from an input signal, the method comprising:
when the first mode control loop is activated, utilizing the analog PWM to generate the output signal from the input signal; and
when the second mode control loop is activated, utilizing the digital PWM to generate the output signal from the input signal, and the digital PWM receives its input from a controller configured to generate such input to the digital PWM based on a difference between the input signal and a feedback signal generated by a feedback path of the second mode control loop.

32. The method of claim 31, wherein the digital PWM and the analog PWM are arranged such that the analog PWM receives an output of the digital PWM as an input of the analog PWM.

33. The method of claim 31, further comprising when the first control loop is activated, utilizing the analog PWM and the digital PWM to generate the output signal from the input signal.

34. The method of claim 33, further comprising simultaneously activating both the first control loop and the second control loop.

35. The method of claim 31, further comprising simultaneously activating both the first control loop and the second control loop.

36. The method of claim 31, wherein the first mode control loop comprises a voltage-mode control loop.

37. The method of claim 31, wherein the second mode control loop comprises a current-mode control loop.

38. The method of claim 31, wherein the second mode control loop comprises a voltage-mode control loop.

39. The method of claim 31, wherein the system further comprises a feedback path comprising:
   an analog-to-digital converter configured to receive an analog signal indicative of the output signal and convert the analog signal to an equivalent digital feedback signal; and
   a low-latency feedback filter configured to filter the digital feedback signal to generate a filtered digital feedback signal and provide the filtered digital feedback signal as an input signal to the controller.

40. The method of claim 39, further comprising decimating, with the low-latency feedback filter, the digital feedback signal to generate the filtered digital feedback signal.

41. The method of claim 39, further comprising reducing noise present in the digital feedback signal with the low-latency feedback filter.

42. The method of claim 40, further comprising combining, with the low-latency feedback filter, multiple digitized signal sources in order to generate the filtered digital feedback signal.

43. The method of claim 31, wherein the system further comprises a feedforward filter coupled between a reference input and an input of the controller.

44. The method of claim 43, wherein the feedforward filter is configured such that the combined responses of the feedforward filter, the controller, and a feedback path of the system provide desired spectral properties for the system.

45. The method of claim 44, wherein the feedforward filter is configured with poles and zeroes to cancel dominant poles and zeroes of a closed-loop transfer function defined by the controller and the feedback path.

46. The method of claim 45, wherein the feedforward filter is configured with poles and zeroes such that a first bandwidth between the reference input and the output of the reconfigurable PWM is higher than a second bandwidth of the controller.

47. The method of claim 45, wherein the feedforward filter is configured with poles and zeroes such that a first bandwidth between the reference input and the output of the reconfigurable PWM is lower than a second bandwidth of the controller.

48. The method of claim 45, wherein:
   the controller comprises a plurality of integrators including a final stage integrator; and
   the final stage integrator is limited by a saturation limit.

49. The method of claim 48, further comprising dynamically adjusting the saturation limit in real time based on one or more of an amplifier mode of the system, conditions of a load driven by a driver stage that receives the output signal of the reconfigurable PWM, a supply voltage supplied to the driver stage, and a user-established voltage limit.

50. The method of claim 48, further comprising receiving the saturation limit from a monitoring circuit external to the system.

51. The method of claim 48, wherein a detection of violation of the saturation limit is received via an interrupt for external management of a condition causing the violation.

52. The method of claim 31, wherein the controller comprises a low-frequency resonator section.

53. The method of claim 52, wherein a resonance frequency of the low-frequency resonator section is significantly less than a bandwidth between reference input and the output of the reconfigurable PWM.

54. The method of claim 52, further comprising independently controlling control parameters of the low-frequency resonator section and other portions of the controller.

55. The method of claim 54, wherein the control parameters comprise a quality factor and a resonant frequency of the low-frequency resonator section.

56. The method of claim 55, wherein the quality factor and the resonant frequency are tunable based on properties of a resonant load driven by a driver stage that receives the output signal of the reconfigurable PWM.

57. The method of claim 31, wherein the system further comprises a variable-strength driver stage that receives the output signal of the reconfigurable PWM.

58. The method of claim 57, further comprising detecting power conditions on an output of the variable-strength driver stage and controlling a strength of the variable-strength driver stage in order to minimize switching losses of the variable-strength driver stage.

59. The method of claim 57, further comprising modifying one or more filter parameters of the controller in response to a change in the strength of the variable-strength driver stage.

60. The method of claim 31, wherein the controller comprises a digital proportional integral derivative controller.

* * * * *